(12) United States Patent
Jeong et al.

(10) Patent No.: US 11,024,631 B2
(45) Date of Patent: Jun. 1, 2021

(54) INTEGRATED CIRCUIT DEVICE INCLUDING FIELD ISOLATION LAYER AND METHOD OF MANUFACTURING THE SAME

(71) Applicant: SAMSUNG ELECTRONICS CO., LTD., Suwon-si (KR)

(72) Inventors: Won Cheol Jeong, Hwaseong-si (KR); Hag Ju Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 16/504,867

(22) Filed: Jul. 8, 2019

(65) Prior Publication Data
US 2020/0227421 A1    Jul. 16, 2020

(30) Foreign Application Priority Data

Jan. 16, 2019   (KR) ........................ 10-2019-0005646

(51) Int. Cl.
*H01L 27/11* (2006.01)
*H01L 29/78* (2006.01)
*H01L 27/092* (2006.01)

(52) U.S. Cl.
CPC ...... *H01L 27/1104* (2013.01); *H01L 27/0924* (2013.01); *H01L 29/7846* (2013.01)

(58) Field of Classification Search
CPC ............ H01L 27/1104; H01L 29/7846; H01L 27/0924; H01L 27/0207; H01L 21/823821; H01L 29/7854; H01L 29/66545
See application file for complete search history.

(56) References Cited

U.S. PATENT DOCUMENTS

| 6,297,135 | B1* | 10/2001 | Talwar ................... H01L 21/22 438/592 |
| 7,871,897 | B2 | 1/2011 | Shin et al. |
| 8,878,309 | B1 | 11/2014 | Hong et al. |
| 9,412,616 | B1 | 8/2016 | Xie et al. |
| 9,508,727 | B2 | 11/2016 | Park et al. |
| 9,875,938 | B2 | 1/2018 | Jeong et al. |
| 9,984,932 | B1 | 5/2018 | Zang et al. |
| 2012/0299090 | A1* | 11/2012 | Kim ................... H01L 29/66666 257/331 |
| 2015/0357326 | A1* | 12/2015 | Bae ................... H01L 29/66606 257/368 |

(Continued)

*Primary Examiner* — Karen Kusumakar
*Assistant Examiner* — Adam S Bowen
(74) *Attorney, Agent, or Firm* — F. Chau & Associates, LLC

(57) ABSTRACT

An integrated circuit device includes a static random access memory (SRAM) array, and the SRAM array includes first to fourth active fins extending parallel to each other in a first direction, a first gate line overlapping the second to fourth active fins, a second gate line spaced apart from the first gate line in the first direction and overlapping the first to third active fins, a third gate line spaced apart from the first gate line in the first direction and overlapping the fourth active fin, a fourth gate line spaced apart from the second gate line in the first direction and overlapping the first active fin, a first field isolation layer contacting one end of the second active fin, and a second field isolation layer contacting one end of the third active fin. The first to fourth gate lines extend in a second direction intersecting the first direction.

20 Claims, 15 Drawing Sheets

(56) References Cited

U.S. PATENT DOCUMENTS

2016/0190141 A1\* 6/2016 Lee ................... H01L 29/7851
                                                                257/390
2017/0179252 A1\* 6/2017 Tang ................ H01L 29/66446
2018/0083036 A1   3/2018 Agarwal et al.

\* cited by examiner

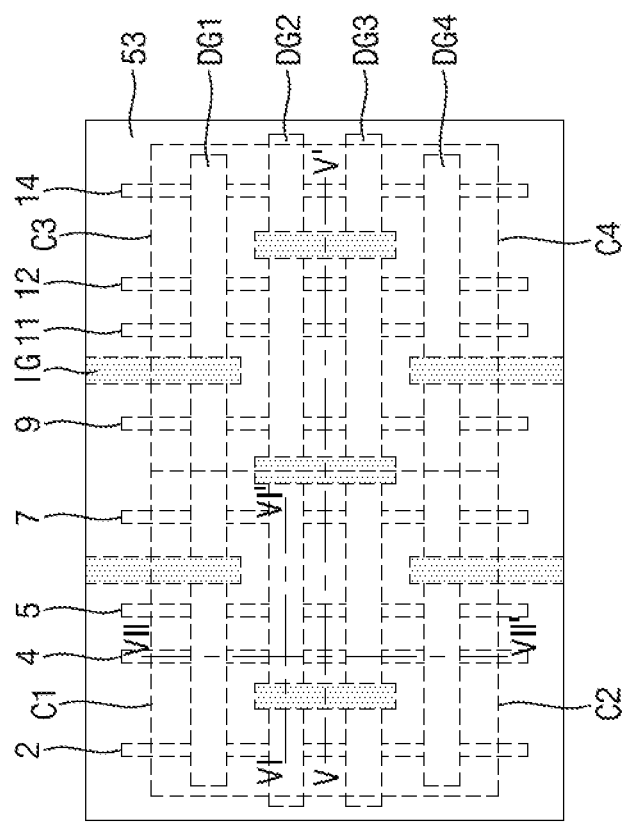

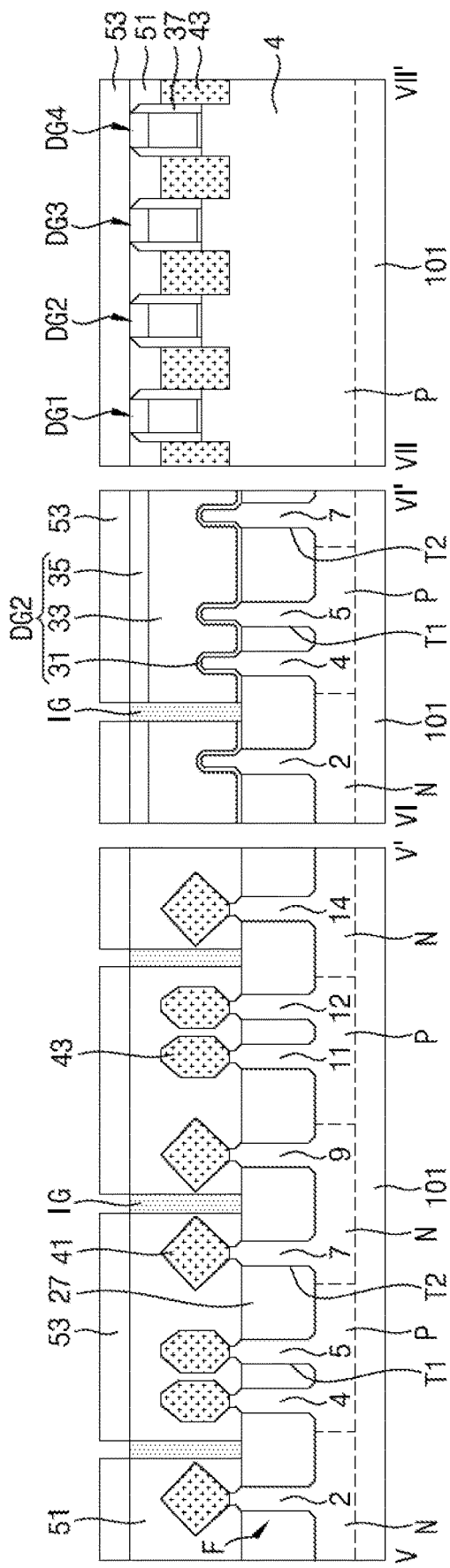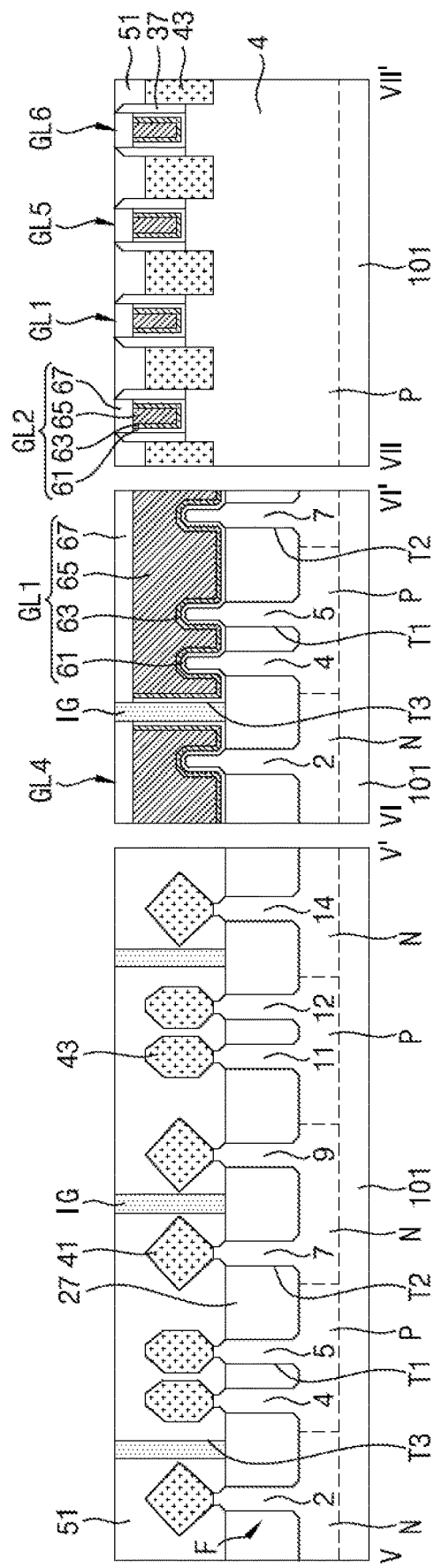

INTEGRATED CIRCUIT DEVICE INCLUDING FIELD ISOLATION LAYER AND METHOD OF MANUFACTURING THE SAME

CROSS-REFERENCE TO RELATED APPLICATION

This U.S. non-provisional patent application claims priority under 35 U.S.C. § 119 to and the benefit of Korean Patent Application No. 10-2019-0005646, filed on Jan. 16, 2019, in the Korean Intellectual Property Office (KIPO), the disclosure of which is incorporated by reference herein in its entirety.

TECHNICAL FIELD

The present inventive concept relates to an integrated circuit device including a field isolation layer and a method of manufacturing the same.

DISCUSSION OF RELATED ART

With the ever increasing demand for higher integration density of semiconductor devices these days, it is becoming increasingly difficult to realize transistor performance required by users. To overcome this difficulty, various field-effect transistor (FET) structures have been proposed. For example, a high-k dielectric/metal gate structure has been proposed to replace a conventional FET structure using silicon oxide and polycrystalline silicon as a gate insulating layer and a gate electrode material, respectively.

As the feature size of an FET is reduced, the length of a gate and the length of a channel formed below the gate may also be reduced. Shorter channel length may decrease the FET reliability. Thus, to enhance the operational stability and reliability of transistors, which are important factors in determining the performance of integrated circuits, various efforts for enhancing manufacturing processes and structures of integrated circuit devices have been made.

SUMMARY

Exemplary embodiments of the present inventive concept provide an integrated circuit device with enhanced integration density and performance, and a method of manufacturing the same.

An integrated circuit device according to an exemplary embodiment of the present inventive concept includes a static random access memory (SRAM) array including a plurality of SRAM cells on a substrate, and the SRAM array includes first to fourth active fins extending in a first direction and disposed to be parallel to each other, a first gate line extending in a second direction intersecting the first direction and overlapping the second to fourth active fins, a second gate line spaced apart from the first gate line in the first direction, extending in the second direction, and overlapping the first to third active fins, a third gate line spaced apart from the first gate line in the first direction, extending in the second direction, and overlapping the fourth active fin, a fourth gate line spaced apart from the second gate line in the first direction, extending in the second direction, and overlapping the first active fin, a first field isolation layer being in contact with one end of the second active fin, and a second field isolation layer being in contact with one end of the third active fin.

An integrated circuit device according to an exemplary embodiment of the present inventive concept includes a static random access memory (SRAM) array including a plurality of SRAM cells on a substrate, and the SRAM array includes active fins extending in a first direction on the substrate, gate lines intersecting the active fins and extending in a second direction perpendicular to the first direction, inverters including pull-up transistors and pull-down transistors formed at intersections of the active fins and the gate lines, pass transistors connected to output nodes of the inverters, and a field isolation layer being in a straight line with the pull-up transistors in the first direction. The gate lines may include first gate lines shared by the pull-up transistors and the pull-down transistors, and second gate lines shared by the pass transistors.

An integrated circuit device according to an exemplary embodiment of the present inventive concept includes a substrate including an NMOS region and a PMOS region, a first active fin extending in a first direction in the PMOS region on the substrate, a second active fin extending in the first direction in the PMOS region on the substrate and spaced apart from the first active fin in the first direction, a device isolation layer covering a lower sidewall of each of the first active fin and the second active fin and extending in the first direction, a first gate line intersecting the first active fin on the device isolation layer and extending in a second direction intersecting the first direction, a second gate line intersecting the second active fin on the device isolation layer and extending in the second direction, and a field isolation layer disposed between the first active fin, the second active fin, and the device isolation layer. The field isolation layer may be in the PMOS region and may include a nitride.

BRIEF DESCRIPTION OF THE DRAWINGS

The above and other objects and features of the present inventive concept will become more apparent to those of ordinary skill in the art by describing exemplary embodiments thereof in detail with reference to the accompanying drawings, in which:

FIGS. 10 to 24 are plan views and cross-sectional views for describing a method of manufacturing an integrated circuit device including SRAM cells according to an exemplary embodiment of the present inventive concept.

Figure 1:
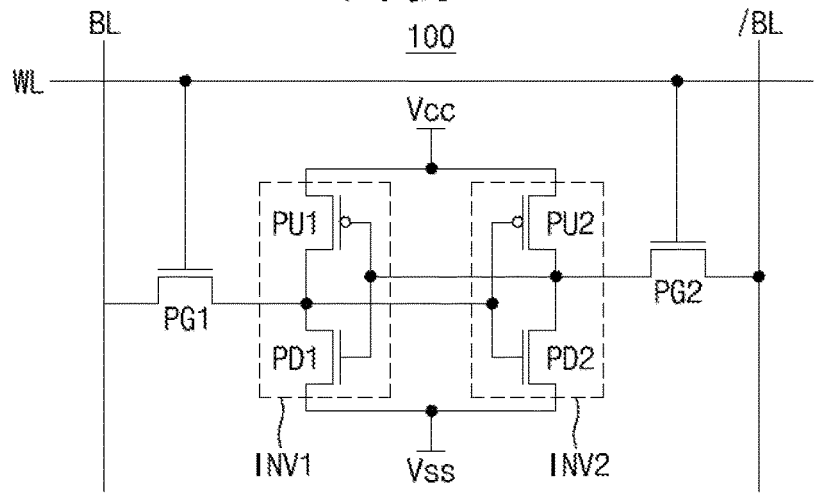
FIG. 1 is a circuit diagram for describing an integrated circuit device according to an exemplary embodiment of the present inventive concept.

Since the drawings in FIGS. 1-24 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the present inventive concept will be described in detail with reference to the accompanying drawings.

FIG. 1 is a circuit diagram for describing an integrated circuit device according to an exemplary embodiment of the present inventive concept.

Referring to FIG. 1, an integrated circuit device 100 may include a pair of inverters INV1 and INV2 connected in parallel to each other between a power node Vcc and a ground node Vss, and a first pass transistor PG1 (or PG-1) and a second pass transistor PG2 (PG-2) respectively connected to output nodes of the inverters INV1 and INV2. The first pass transistor PG1 and the second pass transistor PG2 may be connected to a bit line BL and a complementary bit line /BL, respectively. Gates of the first pass transistor PG1 and the second pass transistor PG2 may be connected to a word line WL.

A first inverter INV1 may include a first pull-up transistor PU1 (or PU-1) and a first pull-down transistor PD1 (or PD-1) connected in series with each other, and a second inverter INV2 may include a second pull-up transistor PU2 (or PU-2) and a second pull-down transistor PD2 (or PD-2) connected in series with each other. The first and second pull-up transistors PU1 and PU2 may be constituted of p-type metal oxide semiconductor (PMOS) transistors, and the first and second pull-down transistors PD1 and PD2 may be constituted of n-type MOS (NMOS) transistors.

For the first and second inverters INV1 and INV2 to constitute one latch circuit, an input node of the first inverter INV1 may be connected to an output node of the second inverter INV2, and an input node of the second inverter INV2 may be connected to an output node of the first inverter INV1. The latch circuit constituted by the first inverter INV1 and the second inverter INV2 may be used to store data, and through the bit line BL, the complementary bit line /BL, and the word line WL, data may be stored to or read from the latch circuit constituted by the first inverter INV1 and the second inverter INV2.

Figure 2:
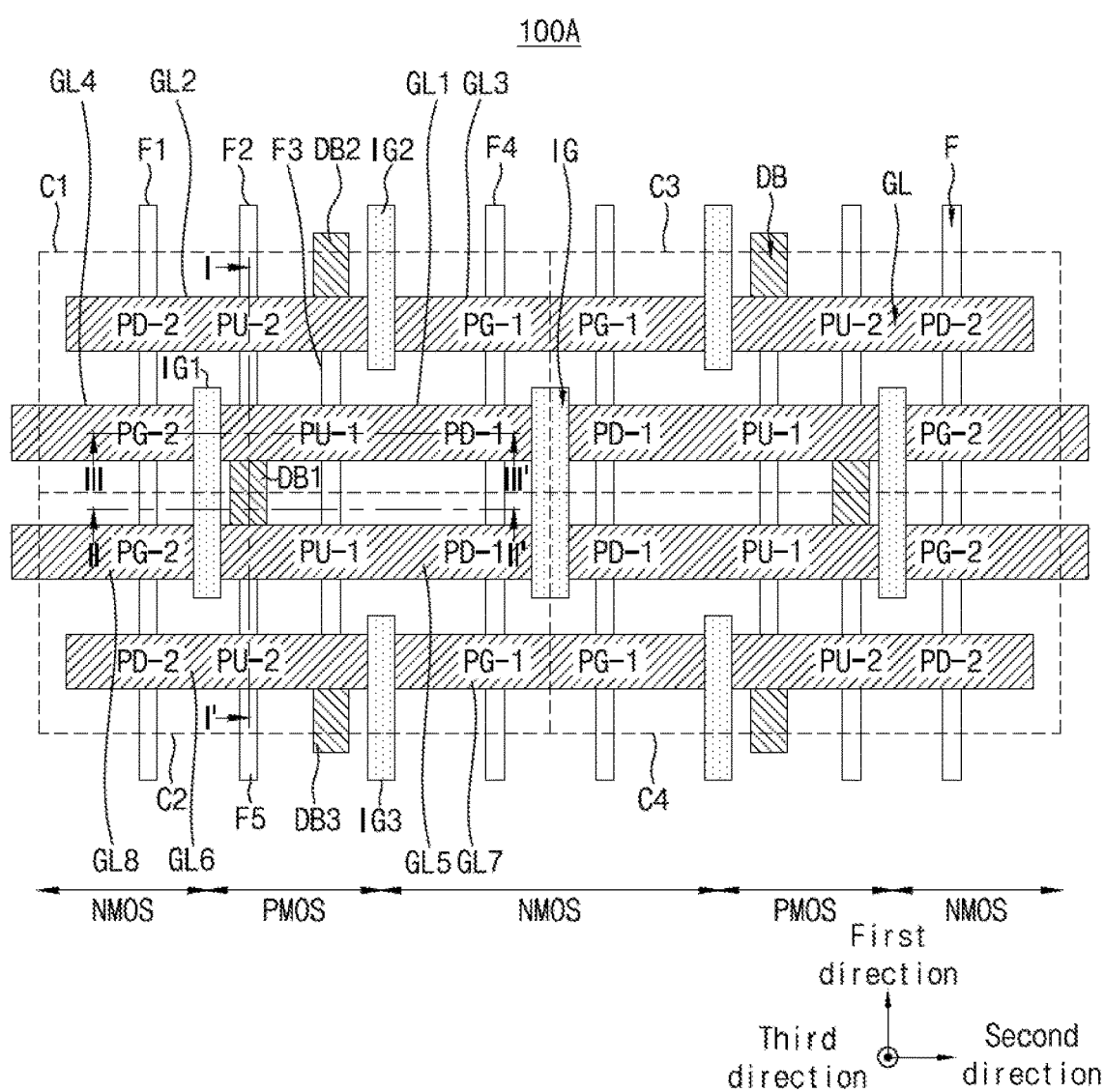
FIG. 2 is a plan view schematically illustrating main components of an integrated circuit device according to an exemplary embodiment of the present inventive concept.

FIG. 2 is a plan view schematically illustrating main components of an integrated circuit device according to an exemplary embodiment of the present inventive concept.

Referring to FIG. 2, an integrated circuit device 100A may include a static random access memory (SRAM) array including a plurality of SRAM cells C1, C2, C3, and C4 arranged in a matrix on a substrate. The SRAM cells C1, C2, C3, and C4 constituting the SRAM array may include six fin field-effect transistors (finFETs) per one memory cell. Each of the SRAM cells C1, C2, C3, and C4 may have the circuit configuration illustrated in FIG. 1. The SRAM cells C1, C2, C3, and C4 may each include a first pull-up transistor PU1, a first pull-down transistor PD1, a first pass transistor PG1, a second pull-up transistor PU2, a second pull-down transistor PD2, and a second pass transistor PG2.

In an exemplary embodiment of the present inventive concept, the first pull-up transistor PU1 and the second pull-up transistor PU2 may each be constituted of a PMOS transistor, and the first pull-down transistor PD1, the second pull-down transistor PD2, the first pass transistor PG1, and the second pass transistor PG2 may each be constituted of an NMOS transistor. As shown in FIG. 1 above, the first pull-up transistor PU1 and the second pull-up transistor PU2 (PMOS transistors) may be connected to the power node Vcc and the first pull-down transistor PD1 and the second pull-down transistor PD2 (NMOS transistors) may be connected to the ground node Vss.

The SRAM cells C1, C2, C3, and C4 may include active fins F1, F2, F3, F4, F5, and F, gate lines GL, gate isolation layers IG1, IG2, IG3, and IG, and field isolation layers DB1, DB2, DB3, and DB. Here, first to third field isolation layers DB1, DB2, and DB3 may each also be represented by DB. In other words, DB may represent any of the field isolation layers DB1, DB2, DB3 and others without being restricted to just representing a specific one field isolation layer. The same as described above may also be applied to F, GL and IG. The field isolation layers DB1, DB2, DB3, and DB may also be referred to as diffusion breaks. Hereinafter, a first SRAM cell C1 and a second SRAM cell C2 among the four SRAM cells shown in FIG. 2 will be mainly described. A third SRAM cell C3 and a fourth SRAM cell C4 may have structures symmetrical to the first SRAM cell C1 and the second SRAM cell C2.

In the first SRAM cell C1 and the second SRAM cell C2, the active fins F1, F2, F3, F4, F5, and F may include first to fifth active fins F1, F2, F3, F4, and F5. The active fins F1, F2, F3, F4, F5, and F may be disposed to extend long in a first direction and to be spaced apart from and parallel to each other in a second direction crossing the first direction. In an exemplary embodiment of the present inventive concept, the first direction may be perpendicular to the second direction. The active fins F1, F2, F3, F4, F5, and F may be classified into first type fins having a relatively long length and second type fins having a relatively short length. For example, in the first SRAM cell C1 and the second SRAM cell C2, the first type fins may include the first active fin F1 and the fourth active fin F4, and the second type fins may include the second active fin F2, the third active fin F3, and the fifth active fin F5.

The second active fin F2 and the fifth active fin F5 may be disposed in a straight line to be spaced apart from each other in the first direction. The third active fin F3 may be disposed to be misaligned from the second and fifth active fins F2 and F5 in the second direction. For example, the third active fin F3 may extend to be in parallel with the second active fin F2 and the fifth active fin F5 in the first direction, and may be spaced apart from the second active fin F2 and the fifth active fin F5 in the second direction.

In the first SRAM cell C1 and the second SRAM cell C2, the gate lines GL may include first to eighth gate lines GL1, GL2, GL3, GL4, GL5, GL6, GL7, and GL8. In the SRAM cells C1, C2, C3, and C4 of the SRAM array, the gate lines GL may extend to be parallel to each other in the second direction intersecting the active fins F1, F2, F3, F4, F5, and F, which extend in the first direction. A transistor may be formed at each intersection of the gate lines GL and the active fins F1, F2, F3, F4, F5, and F. For example, in the first SRAM cell C1, a transistor is formed at each of six intersections of the gate lines GL and the active fins F1, F2, F3, and F4, and thus six transistors may be formed in the first SRAM cell C1. Similarly, six transistors may be formed in each of the SRAM cells C2, C3, and C4 of the SRAM array.

First to fourth gate lines GL1, GL2, GL3, and GL4 may be disposed in the first SRAM cell C1. The first gate line GL1 may overlap the third and fourth active fins F3 and F4, and may also overlap the second active fin F2. The first pull-up transistor PU1 may be formed at an intersection of the first gate line GL1 and the third active fin F3. Thus, the second field isolation layer DB2 may be in a straight line with the first pull-up transistors PU1 in the first direction. The first pull-down transistor PD1 may be formed at an intersection of the first gate line GL1 and the fourth active fin F4. A second gate line GL2 may overlap the first and second active fins F1 and F2, and may be spaced apart from and parallel to the first gate line GL1 in the first direction. The second gate line GL2 may also overlap the third active fin F3. The second pull-up transistor PU2 may be formed at an intersection of the second gate line GL2 and the second active fin F2. Thus, the first field isolation layer DB1 may be in a straight line with the second pull-up transistors PU2 in the first direction. The second pull-down transistor PD2 may be formed at an intersection of the second gate line GL2 and the first active fin F1. A third gate line GL3 may overlap the fourth active fin F4 and may be disposed apart from the second gate line GL2 in the second direction in a straight line. Also, the third gate line GL3 may be spaced apart from and parallel to the first gate line GL1 in the first direction. The first pass transistor PG1 may be formed at an intersection of the third gate line GL3 and the fourth active fin F4. A fourth gate line GL4 may overlap the first active fin F1 and may be disposed apart from the first gate line GL1 in the second direction in a straight line. Also, the fourth gate line GL4 may be spaced apart from and parallel to the second gate line GL2 in the first direction. The second pass transistor PG2 may be formed at an intersection of the fourth gate line GL4 and the first active fin F1.

Fifth to eighth gate lines GL5, GL6, GL7, and GL8 may be disposed in the second SRAM cell C2. A fifth gate line GL5 may overlap the third and fourth active fins F3 and F4 and may be spaced apart from and parallel to the first gate line GL1 in the first direction. The fifth gate line GL5 may also overlap the fifth active fin F5. The first pull-up transistor PU1 may be formed at an intersection of the fifth gate line GL5 and the third active fin F3. Thus, the third field isolation layer DB3 may be in a straight line with the first pull-up transistors PU1 in the first direction. A sixth gate line GL6 may overlap the first and fifth active fins F1 and F5. The sixth gate line GL6 may also overlap the third active fin F3. A seventh gate line GL7 may overlap the fourth active fin F4, and may be disposed apart from the sixth gate line GL6 in the second direction in a straight line. Also, the seventh gate line GL7 may be spaced apart from and parallel to the fifth gate line GL5 in the first direction. An eighth gate line GL8 may overlap the first active fin F1 and may be disposed apart from the fifth gate line GL5 in the second direction in a straight line. Also, the eighth gate line GL8 may be spaced apart from and parallel to the sixth gate line GL6 in the first direction. Six transistors may also be formed in the second SRAM cell C2 in a manner the same as that described in the first SRAM cell C1. For example, first type gate lines, which may include the first gate line GL1, the second gate line GL2, the fifth gate line GL5 and the sixth gate line GL6, may be shared by the pull-up transistors PU1 and PU2 and the pull-down transistors PD1 and PD2, and second type gate lines, which may include the third gate line GL3, the fourth gate line GL4, the seventh gate line GL7 and the eighth gate line GL8, may be shared by the pass transistors PG1 and PG2. For example, the first type gate lines may be shared by transistors having channels of different conductivity types selected from the NMOS transistors and the PMOS transistors. The second type gate lines may be shared by transistors having channels of the same conductivity type selected from the NMOS transistors and the PMOS transistors.

In the first SRAM cell C1 and the second SRAM cell C2, the gate isolation layers IG1, IG2, IG3, and IG may include first to third gate isolation layers IG1, IG2, and IG3. The gate isolation layers IG1, IG2, IG3, and IG may be disposed between the gate lines GL spaced apart from each other in the second direction. A first gate isolation layer IG1 may be disposed between the first gate line GL1 and the fourth gate line GL4 in the first SRAM cell C1. The first gate isolation layer IG1 may also be disposed between the fifth gate line GL5 and the eighth gate line GL8 in the second SRAM cell C2 by extending long in the first direction. Alternatively, the first gate isolation layer IG1 may be divided to two, with one being disposed between the first gate line GL1 and the fourth gate line GL4 and the other one being disposed between the fifth gate line GL5 and the eighth gate line GL8. A second gate isolation layer IG2 may be disposed between the second gate line GL2 and the third gate line GL3. A third gate isolation layer IG3 may be disposed between the sixth gate line GL6 and the seventh gate line GL7.

In the first SRAM cell C1 and the second SRAM cell C2, the field isolation layers DB1, DB2, DB3, and DB may include first to third field isolation layers DB1, DB2, and DB3. The field isolation layers DB may be disposed in a straight line with the active fins F2, F3, and F5. For example, the first field isolation layer DB1 may be disposed in a straight line with the second and fifth active fins F2 and F5, and the second and third field isolation layers DB2 and DB3 may be disposed in a straight line with the third active fin F3. The first field isolation layer DB1 may be disposed between the second active fin F2 and the fifth active fin F5 in the first direction. The first field isolation layer DB1 may also be disposed between the first gate line GL1 and the fifth gate line GL5. In an exemplary embodiment of the present inventive concept, the first field isolation layer DB1 may be in contact with a sidewall (i.e., side surface) of the first gate line GL1 and a sidewall (i.e., side surface) of the fifth gate line GL5. However, the present inventive concept is not limited thereto, and the first field isolation layer DB1 may be spaced apart from the first and fifth gate lines GL1 and GL5 in the first direction. In an exemplary embodiment of the present inventive concept, the first field isolation layer DB1 may be in contact with one end of the second active fin F2, and one end of the fifth active fin F5.

A second field isolation layer DB2 and a third field isolation layer DB3 may be disposed in a straight line with the third active fin F3. In an exemplary embodiment of the present inventive concept, the second field isolation layer DB2 may be in contact with a sidewall (i.e., side surface) of the second gate line GL2, and the third field isolation layer DB3 may be in contact with a sidewall (i.e., side surface) of the sixth gate line GL6. However, the present inventive concept is not limited thereto, and as in the first field isolation layer DB1, which may be spaced apart from the first and fifth gate lines GL1 and GL5, the second field isolation layer DB2 may be spaced apart from the second gate line GL2 in the first direction, and the third field isolation layer DB3 may be spaced apart from the sixth gate line GL6 in the first direction. In an exemplary embodiment of the present inventive concept, the second field isolation layer DB2 may be in contact with one end of the third active fin F3, and the third field isolation layer DB3 may be in contact with the other end of the third active fin F3.

Figure 3:
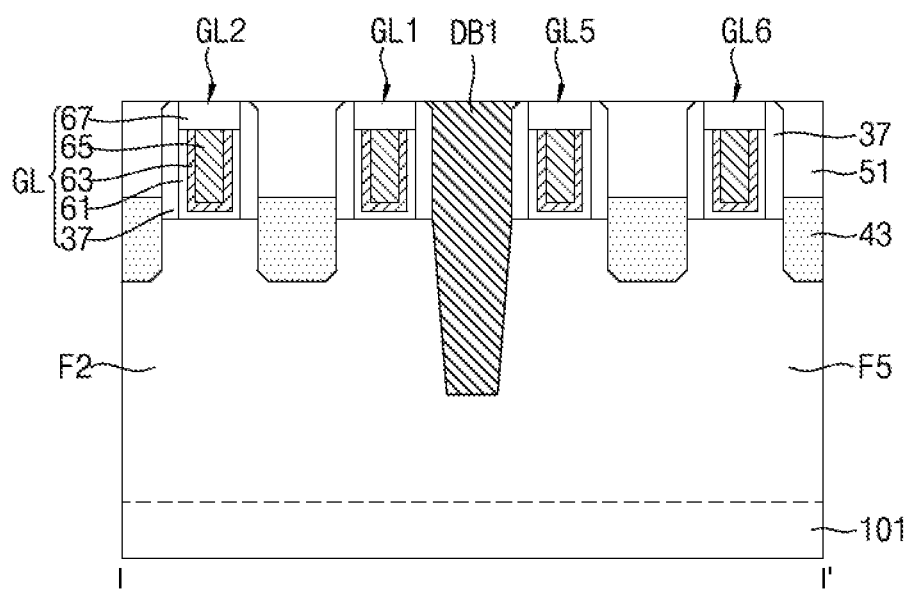
FIG. 3 is a cross-sectional view taken along line I-I' of FIG. 2 according to an exemplary embodiment of the present inventive concept.
Figure 4A:
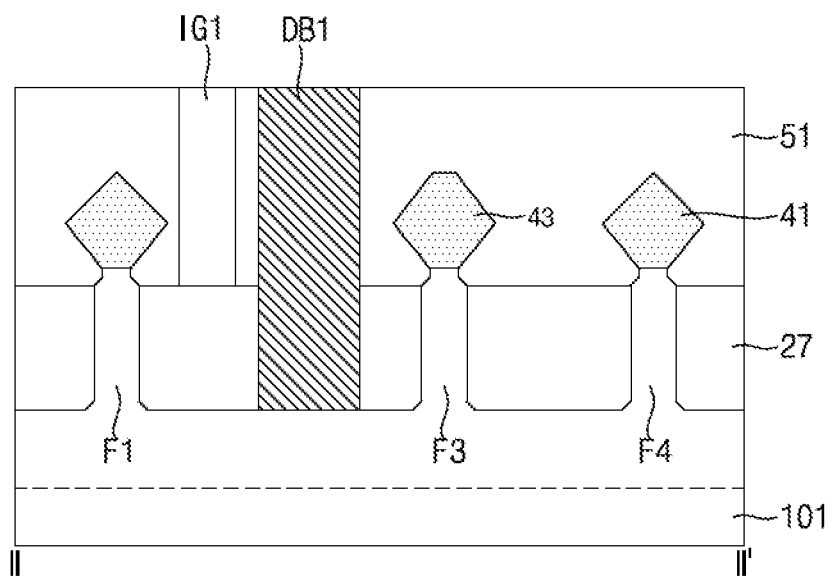
FIGS. 4A and 4B are cross-sectional views each taken along line II-II' of FIG. 2 according to an exemplary embodiment of the present inventive concept.
Figure 4B:
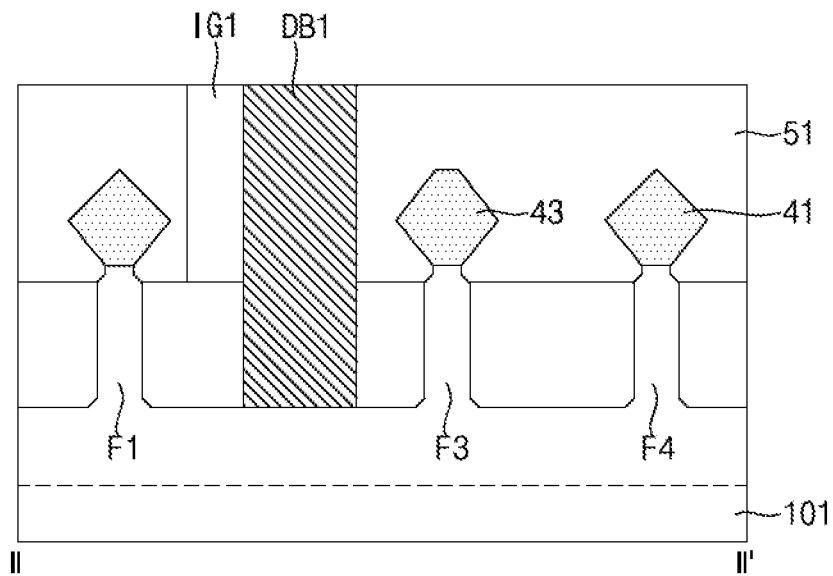
Figure 5A:
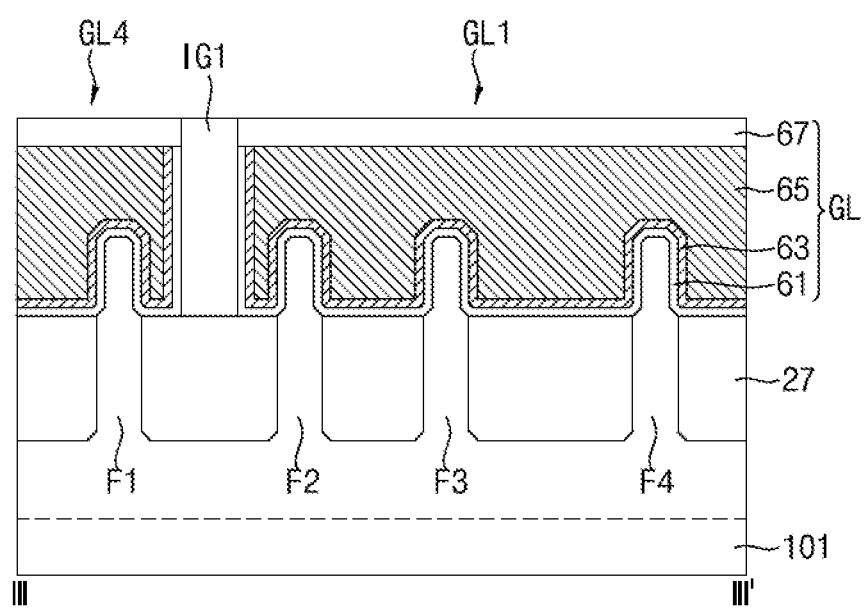
FIGS. 5A and 5B are cross-sectional views each taken along line III-III' of FIG. 2 according to an exemplary embodiment of the present inventive concept.
Figure 5B:
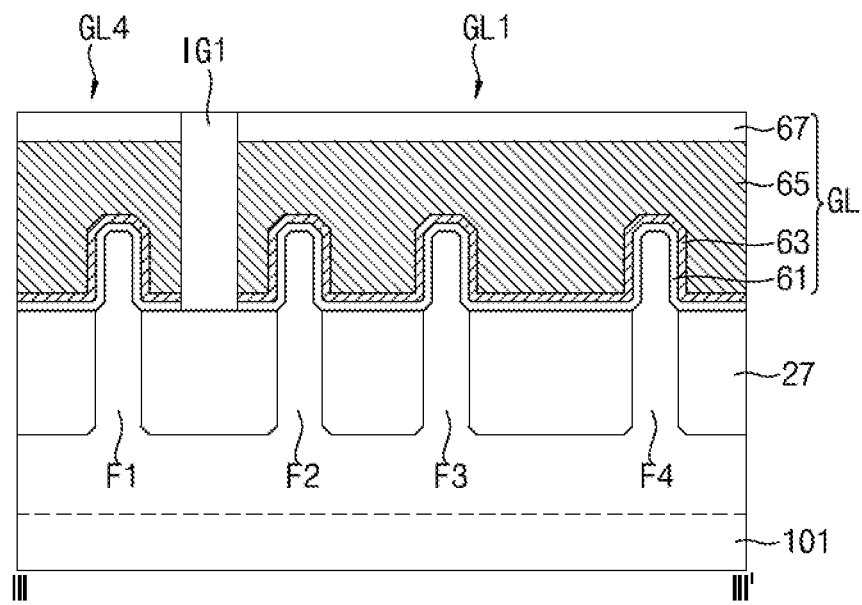

FIG. 3 is a cross-sectional view taken along line I-I' of FIG. 2 according to an exemplary embodiment of the present inventive concept. FIGS. 4A and 4B are cross-sectional views taken along line II-II' of FIG. 2 each according to an exemplary embodiment of the present inventive concept. FIGS. 5A and 5B are cross-sectional views taken along line III-III' of FIG. 2 each according to an exemplary embodiment of the present inventive concept. In FIGS. 1 to 5B, like numerals refer to like elements. Hereinafter, substantially the same contents as those described with reference to FIGS. 1 and 2 will be omitted for brevity. Referring to FIGS. 2 to 5B, SRAM cells C1, C2, C3, and C4 may include a substrate 101, active fins F1, F2, F3, F4, F5, and F, a device isolation layer 27, gate lines GL1, GL2, GL3, GL4, GL5, GL6, GL7, GL8, and GL, gate isolation layers IG1, IG2, IG3, and IG, field isolation layers DB1, DB2, DB3, and DB, source and drain regions 41 and 43, and an interlayer insulating layer 51.

The substrate 101 may include a first region and a second region. For example, the first region may be a PMOS region, and the second region may be an NMOS region. The first region and the second region may be alternately disposed in a second direction. The PMOS transistors may be formed in the PMOS region, and the NMOS transistors may be formed in the NMOS region. The substrate 101 may include a semiconductor material, such as, for example, silicon (Si) and/or germanium (Ge). For example, the substrate 101 may be formed of at least one material selected from, for example, Si, Ge, silicon germanium (SiGe), gallium phosphide (GaP), gallium arsenide (GaAs), silicon carbide (SiC), silicon germanium carbide (SiGeC), indium arsenide (InAs), indium phosphide (InP), gallium antimonide (GaSb), indium antimonide (InSb), and indium gallium arsenide (InGaAs). However, the substrate 101 according to the present inventive concept is not limited to the above-described examples. In an exemplary embodiment of the present inventive concept, the substrate 101 may be a silicon on insulator (SOI) substrate.

The active fins F1, F2, F3, F4, F5, and F may each protrude from a main surface of the substrate 101 in a third direction on the substrate 101. The third direction may be perpendicular to the first and second directions. Each of the active fins F1, F2, F3, F4, F5, and F may include major-axial sidewalls, which extend long in a first direction, and minor-axial sidewalls, which extend short in the second direction. The active fins F1, F2, F3, F4, F5, and F may be disposed to be spaced apart from each other in the first direction so that the minor-axial sidewalls thereof may face each other. For example, the second active fin F2 and the fifth active fin F5 may be disposed to be spaced apart from each other in the first direction with their minor-axial sidewalls facing each other. The active fins F1, F2, F3, F4, F5, and F may be disposed to be spaced apart from each other in the second direction so that at least some of the major-axial sidewalls thereof may face each other.

Gate lines GL1, GL2, GL5, and GL6 may extend to be parallel to each other in the second direction intersecting the first direction. The gate lines GL1, GL2, GL5, and GL6 may extend to cover at least some of upper surfaces and both major-axial sidewalls of the active fins F1, F2, F3, F4, F5, and F The field isolation layer DB1 or DB may be disposed between the gate lines GL spaced apart from each other in the first direction. As shown in FIG. 3, the first field isolation layer DB1 may be in contact with the sidewall of the first gate line GL1 and the sidewall of the fifth gate line GL5. However, the present inventive concept is not limited thereto, and the first field isolation layer DB1 may be spaced apart from the first gate line GL1 and/or the fifth gate line GL5 in the first direction.

Referring to FIGS. 2, 3, 4A, 5A and 5B, the second active fin F2 may extend in the first direction in the PMOS region on the substrate 101, and the fifth active fin F5 may extend in the first direction in the PMOS region on the substrate 101 and spaced apart from the second active fin F2 in the first direction. The device isolation layer 27 may cover a lower sidewall of each of the second active fin F2 and the fifth active fin F5 and extend in the first direction. The first gate line GL1 may intersect the second active fin F2 on the device isolation layer 27 and extend in the second direction intersecting the first direction. The fifth gate line GL5 may intersect the fifth active fin F5 on the device isolation layer 27 and extend in the second direction. The first field isolation layer DB1 may be disposed between the second active fin F2, the fifth active fin F5, and the device isolation layer 27. Thus, the first field isolation layer DB1 may be in the PMOS region and may include a nitride. A level of an upper end of first field isolation layer DB1 may correspond to a level of an upper end of the first gate line GL1.

Referring to FIGS. 3, 4A and 4B, a lower end of the field isolation layer DB1 or DB may extend long downward to levels of lower ends of the active fins F1, F3, and F4 and may be positioned therein. The field isolation layer DB1 or DB may have a tapered shape that decreases in width as it goes downward in the third direction. The field isolation layer DB1 or DB may have a width in the second direction wider than a maximum width of the source and drain regions 41 and 43 in the second direction and narrower than separation distances between active fins F1, F2, F3, F4, F5, and F in the second direction.

As shown in FIGS. 2 and 4A, the field isolation layer DB1 or DB may be disposed to be spaced apart from the first gate isolation layer IG1 in the second direction. For example, the first field isolation layer DB1 may be disposed to be spaced apart from the first gate isolation layer IG1 in the second direction, and the second field isolation layer DB2 may be disposed to be spaced apart from the second gate isolation layer IG2 in the second direction. Alternatively, in an exemplary embodiment of the present inventive concept, as shown in FIG. 4B, one side surface of the field isolation layer DB1 or DB may be in contact with one side surface of the first gate isolation layer IG1. For example, when the field isolation layer DB1 or DB is formed later than the first gate isolation layer IG1, one side surface of the field isolation layer DB1 or DB may be self-aligned to one side surface of the first gate isolation layer IG1. Alternatively, when the first gate isolation layer IG1 is formed later than the field isolation layer DB1 or DB, one side surface of the first gate isolation layer IG1 may be self-aligned to one side surface of the field isolation layer DB1 or DB. The self-aligned approach may simplify the etch and deposition processes in forming the first gate isolation layer IG1 and/or the field isolation layer DB1 or DB. Thus, one side surface of the first field isolation layer DB1 may be in contact with one side surface of the first gate isolation layer IG1, and one side surface of the second field isolation layer DB2 may be in contact with one side surface of the second gate isolation layer IG2.

In an exemplary embodiment of the present inventive concept, the field isolation layer DB1 or DB may include a compressive stress material capable of applying a compressive stress to the active fins F2 and F5. For example, the field isolation layer DB1 or DB is nitride-based materials (i.e., materials including a nitride) and may include materials such as, for example, silicon nitride ($Si_3N_4$) and silicon oxycarbonitride (SiOCN). Alternatively, the field isolation layer DB1 or DB may include the same material as the active fins F1, F2, F3, F4, F5, and F, but the material may be a material capable of applying a compressive stress to the surrounding active fins by being heat treated. The compressive stress material may apply a channel stress to a channel region of the PMOS transistor and enhance mobility of carriers. For example, in a PMOS region, the first field isolation layer DB1 may include a material that applies a compressive stress to the second active fin F2 and the fifth active fin F5, the second field isolation layer DB2 may include a material that applies a compressive stress to the third active fin F3, and the third field isolation layer DB3 may include a material that applies a compressive stress to the third active fin F3.

Each of the gate lines GL may include a gate insulating layer 61, gate electrodes 63 and 65, a gate capping layer 67 and gate spacers 37. The gate insulating layer 61 may extend in the second direction along profiles of the active fins F1, F2, F3, and F4 protruding upward from the device isolation layer 27, and may be disposed between the gate electrodes 63 and 65 and the active fins F1, F2, F3, and F4. Also, the gate insulating layer 61 may be disposed between the gate electrodes 63 and 65 and the device isolation layer 27.

As shown in FIG. 3, the gate insulating layer 61 may be formed in a shape extending in the third direction along a side surface of the gate spacer 37. As shown in FIG. 5A, the gate insulating layer 61 may extend in the third direction along sidewalls of the gate isolation layer IG1.

The gate insulating layer 61 may include a high-k dielectric material having a dielectric constant higher than that of a silicon oxide ($SiO_2$) film. For example, the gate insulating layer 61 may include hafnium oxide ($HfO_2$), zirconium oxide ($ZrO_2$), lanthanum oxide ($La_2O_3$), titanium oxide ($TiO_2$), yttrium oxide ($Y_2O_3$), aluminum oxide ($Al_2O_3$), tantalum oxide ($Ta_2O_5$), or the like.

The gate electrodes 63 and 65 may include at least two layers that are stacked. In an exemplary embodiment of the present inventive concept, the gate electrodes 63 and 65 may include a first gate electrode 63 and a second gate electrode 65.

The first gate electrode 63 may control a work function, and the second gate electrode 65 may serve to fill a space formed by the first gate electrode 63. The first gate electrode 63 may include at least one of, for example, titanium nitride (TiN), tungsten nitride (WN), titanium aluminide (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), and a combination thereof. In addition, the second gate electrode 65 may include at least one of, for example, tungsten (W), aluminum (Al), cobalt (Co), titanium (Ti), tantalum (Ta), copper (Cu), molybdenum (Mo), polysilicon (poly-Si), silicon germanium (SiGe), and a metal alloy.

In an exemplary embodiment of the present inventive concept, as shown in FIG. 5A, the first gate electrode 63 may extend in the third direction along the sidewalls of the first gate isolation layer IG1 together with the gate insulating layer 61. The second gate electrode 65 may be spaced apart from the gate isolation layer IG1.

In an exemplary embodiment of the present inventive concept, as shown in FIG. 5B, the gate insulating layer 61 and the first gate electrode 63 may be in contact with some of the sidewalls of the first gate isolation layer IG1, but may not cover the entire sidewalk of the first gate isolation layer IG1. The sidewalls of the first gate isolation layer IG1 may be in contact with sidewalls of the second gate electrode 65. FIGS. 5A and 5B are views for comparing cross sections of the gate line GL changed according to the difference in a process sequence. When a gate replacement process is performed after the first gate isolation layer IG1 is formed, the gate line GL may have a structure as shown in FIG. 5A, and when the first gate isolation layer IG1 is formed after the gate replacement process is performed, the gate line GL may have a structure as shown in FIG. 5B.

The gate capping layer 67 may be disposed on the gate electrodes 63 and 65 and the gate insulating layer 61, and may extend along the gate electrodes 63 and 65 in the second direction. For example, the gate capping layer 67 may include at least one of, for example, a silicon nitride ($Si_3N_4$) film, silicon carbonitride (SiCN) film, silicon carbon oxynitride (SiCON) film, and a silicon oxynitride (SiON) film. Further, in an exemplary embodiment of the present inventive concept, the gate capping layer 67 may be omitted as needed.

The gate spacers 37 may be disposed on both sides of the gate line GL and extend along the gate line GL in the second direction, and may be in contact with both side surfaces of the gate insulating layer 61 and both side surfaces of the gate capping layer 67. The gate spacer 37 may include a nitride film. For example, the gate spacer 37 may include at least one of, for example, silicon nitride ($Si_3N_4$), silicon oxynitride (SiON), silicon carbonitride (SiCN), silicon oxide ($SiO_2$), silicon oxycarbonitride (SiOCN), and a combination thereof.

The source and drain regions 41 and 43 may be disposed on both sides of the gate spacer 37, and may be disposed on the active fins F1, F2, F3, F4, F5, and F. That is, the source and drain regions 41 and 43 may be formed in regions where some of the active fins F1, F2, F3, F4, F5, and F are etched. Although the source and drain regions 41 and 43 are shown as being spaced apart from each other in FIGS. 4A and 4B, the source and drain regions 41 and 43 may be merged by being in contact with each other in the second direction.

The gate isolation layer IG may be disposed on the device isolation layer 27 between the gate lines GL spaced apart from each other in the second direction. A level of a lower end of the gate isolation layer IG may correspond to a level of an upper end of the device isolation layer 27. Alternatively, the level of the lower end of the gate isolation layer IG may be slightly lower than the level of the upper end of the device isolation layer 27. Thus, One gate line GL may be separated to two by the gate isolation layer IG. In an exemplary embodiment of the present inventive concept, as shown in FIG. 5A, the gate isolation layer IG1 or IG may be in contact with the gate insulating layer 61 and the gate capping layer 67 and may not be in contact with the gate electrodes 63 and 65. Alternatively, as shown in FIG. 5B, the gate isolation layer IG1 or IG may be in contact with the gate insulating layer 61, the gate electrodes 63 and 65, and the gate capping layer 67. The first gate isolation layer IG1 may be disposed to separate the first gate line GL1 and the fourth gate line GL4 in the first SRAM cell C1, and to separate the fifth gate line GL5 and the eighth gate line GL8 in the second SRAM cell C2 by extending long in the first direction. The second gate isolation layer IG2 may be disposed to separate the second gate line GL2 and the third gate line GL3. The third gate isolation layer IG3 may be disposed to separate the sixth gate line GL6 and the seventh gate line GL7.

The interlayer insulating layer 51 may be disposed on the source and drain regions 41 and 43 and the device isolation layer 27. Further, the interlayer insulating layer 51 may be formed to be in contact with outer sidewalls of the gate spacer 37. The interlayer insulating layer 51 may include at least one of, for example, silicon oxide ($SiO_2$), silicon nitride ($Si_3N_4$), silicon oxynitride (SiON), and a low-k dielectric material. As an example, the low-k dielectric material may include carbon-doped silicon oxide, such as SiCOH.

Figure 6:
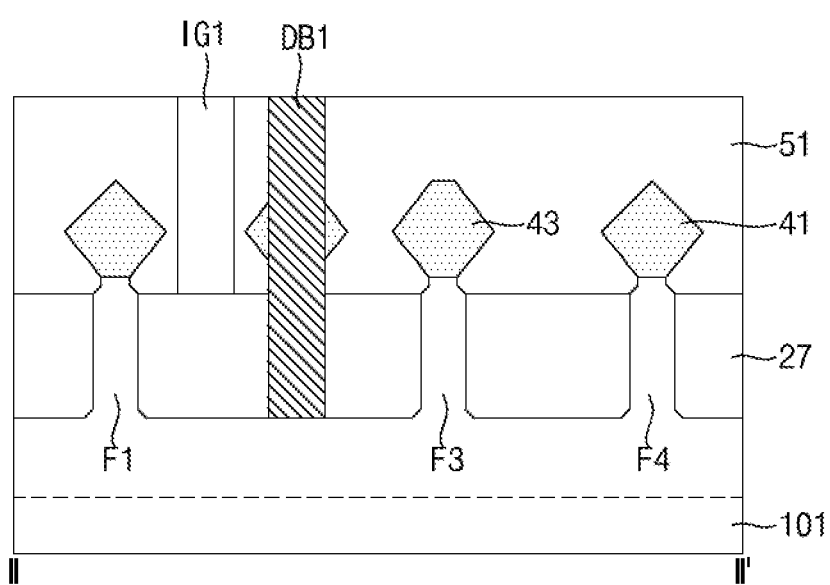
FIG. 6 is a cross-sectional view taken along line II-II' of FIG. 2 according to an exemplary embodiment of the present inventive concept.

FIG. 6 is a cross-sectional view taken along line II-II' of FIG. 2 according to an exemplary embodiment of the present inventive concept. In FIGS. 1 to 6, like numerals refer to like elements. Hereinafter, substantially the same contents as those described with reference to FIGS. 1 and 5B will be omitted for brevity.

Referring to FIG. 6, a width of a field isolation layer DB1 or DB may be greater than a width of an active fin F1, F2, F3, F4, F5, or F in a second direction, and narrower than a width of a source and drain region 41 or 43 in the second direction. However, the present inventive concept is not limited thereto. For example, different from this case, as shown in FIG. 4A, a width of the field isolation layer DB1 or DB may be greater than a maximum width of the source and drain region 41 or 43 in the second direction. In this case, a portion of the source and drain region 43 may remain on both sidewalls of the field isolation layer DB1 or DB and may be in contact with the field isolation layer DB1 or DB. A portion of the source and drain region 43 may remain between the field isolation layer DB1 or DB and a gate isolation layer IG1. Alternatively, a portion of the source and drain region 43 may remain on one sidewall or both sidewalls of the field isolation layer DB1 or DB even when the source and drain regions 41 and 43 adjacent to each other are merged with each other. For example, the source and drain region 41 or 43 may be disposed on each of the first to fifth active fins F1, F2, F3, F4, and F5, in which at least one of two side surfaces of each of the first field isolation layer DB1, the second field isolation layer DB2 and the third field isolation layer DB3 may be in contact with the source and drain region 41 or 43.

Figure 7:
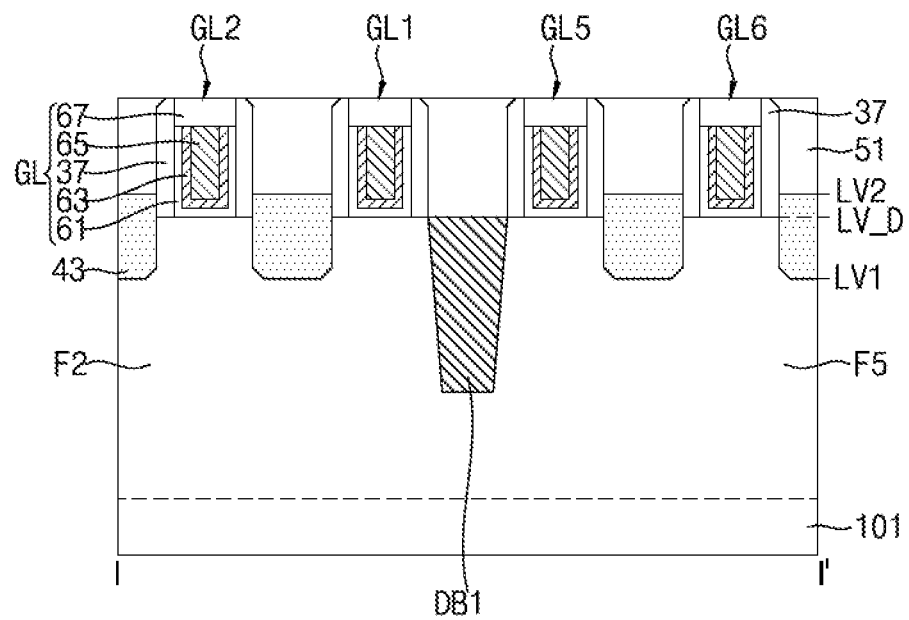
FIG. 7 is a cross-sectional view taken along line I-I' of FIG. 2 according to an exemplary embodiment of the present inventive concept.
Figure 8:
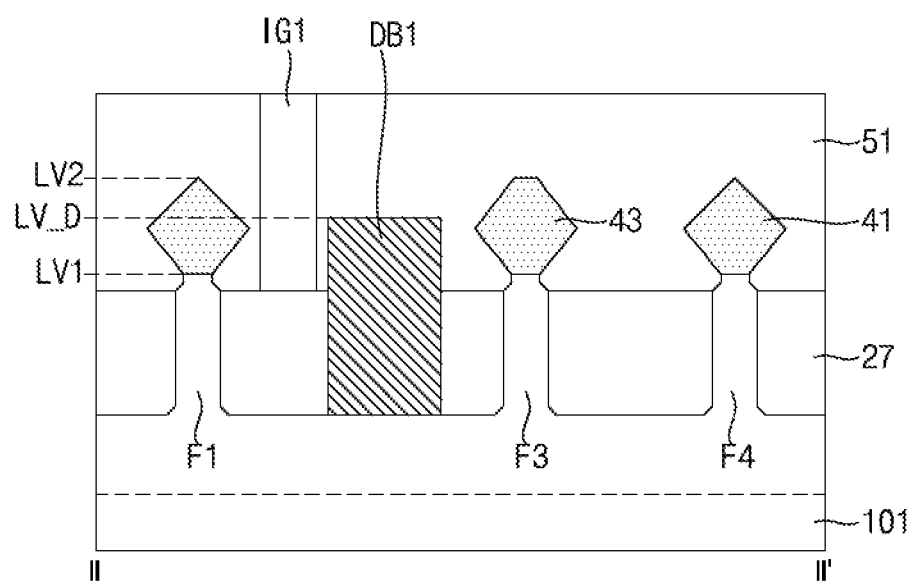
FIG. 8 is a cross-sectional view taken along line II-II' of FIG. 2 according to an exemplary embodiment of the present inventive concept.

FIG. 7 is a cross-sectional view taken along line I-I' of FIG. 2 according to an exemplary embodiment of the present inventive concept. FIG. 8 is a cross-sectional view taken along line II-II' of FIG. 2 according to an exemplary embodiment of the present inventive concept. In FIGS. 1 to 8, like numerals refer to like elements. Hereinafter, substantially the same contents as those described with reference to FIGS. 1 to 6 will be omitted for brevity.

Referring to FIGS. 7 and 8, a level LV_D of an upper end of a field isolation layer DB1 or DB may correspond to levels of upper ends of active fins F2 and F5. For example, levels of upper ends of the first to third field isolation layers DB1, DB2 and DB3 may correspond to levels of upper ends of the first to fifth active fins F1, F2, F3, F4, and F5. The level LV_D of the upper end of the field isolation layer DB may correspond to levels of lower ends of gate lines GL. For example, the level LV_D of the upper end of the field isolation layer DB1 or DB may be lower than levels LV2 of upper ends of the source and drain regions 41 and 43 and higher than levels LV1 of lower ends of the source and drain regions 41 and 43. However, the present inventive concept is not limited thereto, and the level LV_D of the upper end of the field isolation layer DB1 or DB may be higher than the levels of the upper ends of the active fins F2 and F5 and lower than levels of upper ends of the gate lines GL. For example, referring to FIGS. 2 and 7, the first field isolation layer DB1 may include a compressive stress material capable of applying a compressive stress to the active fins F2 and F5 in the PMOS region. For example, the first field isolation layer DB1 may include a nitride. Accordingly, the compressive stress material may apply a channel stress to the channel regions of the PMOS transistors (e.g., first pull-up transistors PU1) and enhance mobility of carriers.

Figure 9:
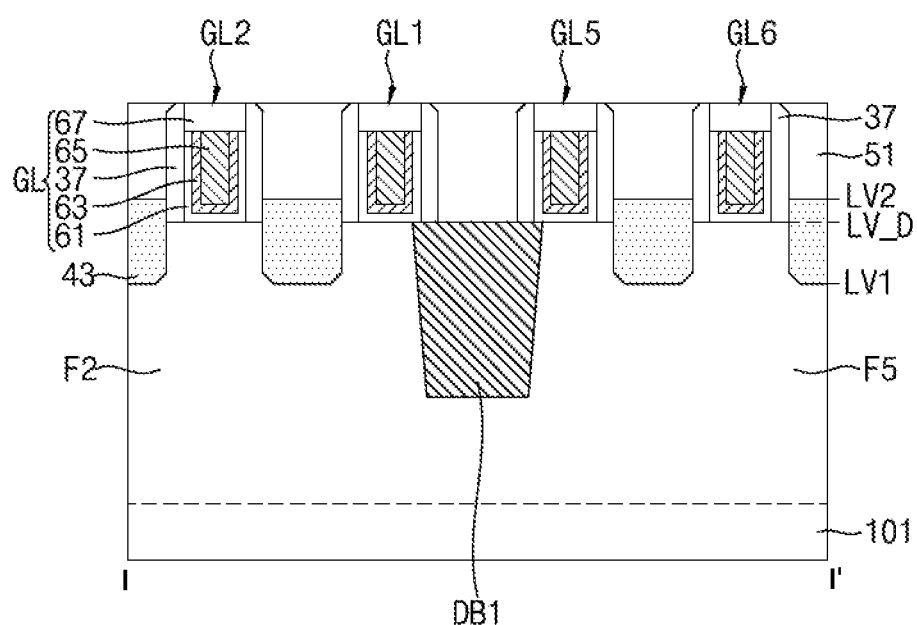
FIG. 9 is a cross-sectional view taken along line I-I' of FIG. 2 according to an exemplary embodiment of the present inventive concept.

FIG. 9 is a cross-sectional view taken along line I-I' FIG. 2 according to an exemplary embodiment of the present inventive concept. In FIGS. 1 to 9, like numerals refer to like elements. Hereinafter, substantially the same contents as those described with reference to FIGS. 1 to 8 will be omitted for brevity.

Referring to FIG. 9, a width of an upper end of a field isolation layer DB1 or DB may be wider than a separation distance of gate lines GL1 and GL5 in the first direction. When viewed from above, a portion of the field isolation layer DB1 or DB may overlap the first gate line GL1 and the fifth gate line GL5. For example, the field isolation layer DB1 or DB may overlap a portion of the first gate line GL1 and a portion of the fifth gate line GL5 in the third direction. A portion of an upper surface of the field isolation layer DB1 or DB may be in contact with lower surfaces of the gate lines GL1 and GL5. Referring to FIGS. 2 and 9, the first field isolation layer DB1 may include a compressive stress material, such as a nitride, capable of applying a compressive stress to the active fins F2 and F5 in the PMOS region.

FIGS. 10 to 24 are views for describing a method of manufacturing an integrated circuit device including SRAM cells according to an exemplary embodiment of the present inventive concept. Like numerals may refer to like elements in FIGS. 1 to 24. Hereinafter, substantially the same contents as those described with reference to FIGS. 1 to 9 will be omitted for brevity.

Figure 10:
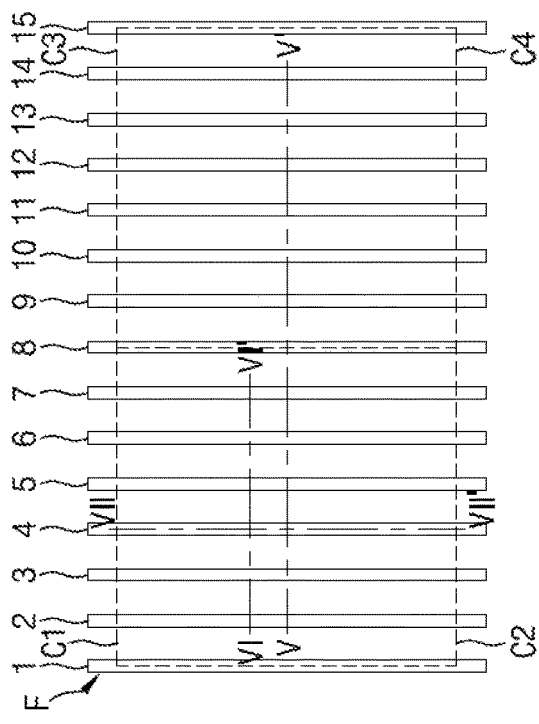
Figure 11:
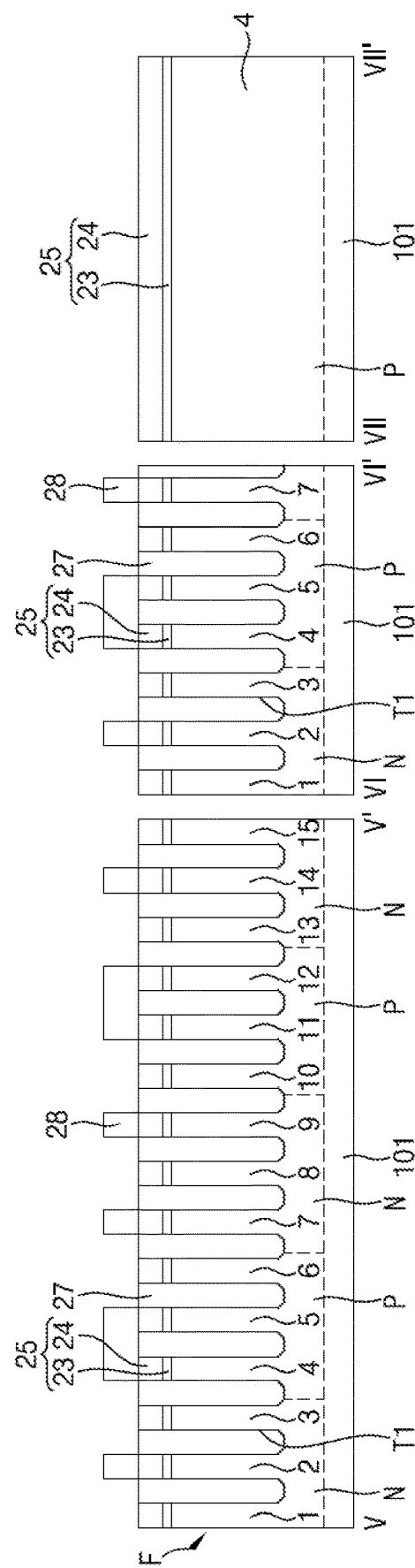

Referring to FIGS. 10 and 11, a first mask pattern 25 may be formed on a substrate 101. The first mask pattern 25 may include a first buffer layer 23 on the substrate and a first mask layer 24 on the first buffer layer 23, and may be used as an etch mask so that an upper portion of the substrate 101 may be partially etched. A plurality of first trenches T1 that define active fins may be formed in the substrate 101 by partially etching the upper portion of the substrate 101 using the first mask pattern 25 as an etch mask. The active fins may include first to fifteenth active fins 1, 2, 3, 4, 5, 6, 7, 8, 9, 10, 11, 12, 13, 14, and 15.

The substrate 101 may include a P-well P and an N-well N. The P-well P and the N-well N may be alternately and repetitively arranged in the substrate. First to third active fins 1, 2, and 3, seventh to ninth active fins 7, 8, and 9, and thirteenth to fifteenth active fins 13, 14, and 15 may be disposed in the N-well N. Fourth to sixth active fins 4, 5, and 6 and tenth to twelfth active fins 10, 11, and 12 may be disposed in the P-well P.

The substrate 101 may be a single-crystalline silicon (Si) wafer having P-type impurities. The P-well P may be formed by implanting P-type impurities into the substrate 101, and the N-well N may be formed by implanting N-type impurities into the substrate 101. For example, the P-type impurities may include boron (B), and the N-type impurities may include phosphorus (P), arsenic (As), or a combination thereof.

The first buffer layer 23 may include an oxide such as silicon oxide ($SiO_2$). The first mask layer 24 may include a material having an etch selectivity with respect to the substrate. The first mask layer 24 may include a nitride such as silicon nitride ($Si_3N_4$). The first trenches T1 may each have a vertical height greater than a horizontal width thereof. Each of the first trenches T1 may have substantially the same horizontal width.

The active fins 1, 2, 3, 4, 5, 6, 7, 8, 9, 10, 11, 12, 13, 14, and 15 may each have a vertical height greater than a horizontal width thereof. Each of the active fins 1, 2, 3, 4, 5, 6, 7, 8, 9, 10, 11, 12, 13, 14, and 15 may have substantially the same horizontal width. Separation distances between any two adjacent active fins of the active fins 1, 2, 3, 4, 5, 6, 7, 8, 9, 10, 11, 12, 13, 14, and 15 may be substantially the same. The active fins 1, 2, 3, 4, 5, 6, 7, 8, 9, 10, 11, 12, 13, 14, and 15 may have substantially the same pitch. The pitch may be defined as a distance between centers of two adjacent active fins of the active fins 1, 2, 3, 4, 5, 6, 7, 8, 9, 10, 11, 12, 13, 14, and 15. Upper surfaces of the active fins 1, 2, 3, 4, 5, 6, 7, 8, 9, 10, 11, 12, 13, 14, and 15 may be formed at substantially the same level. In an exemplary embodiment of the present inventive concept, the P-well P and the N-well N may be formed after the process of defining the active fins 1, 2, 3, 4, 5, 6, 7, 8, 9, 10, 11, 12, 13, 14, and 15 has been performed.

Device isolation layers 27 may be formed in the first trenches T1. The device isolation layer 27 may include an insulating layer, such as, for example, silicon oxide ($SiO_2$), silicon nitride ($Si_3N_4$), silicon oxynitride (SiON), or a combination thereof. In an exemplary embodiment of the present inventive concept, the device isolation layer 27 may include silicon oxide ($SiO_2$).

A second mask pattern 28 may be formed on the device isolation layer 27 and the first mask pattern 25, and may include a material having an etch selectivity with respect to the substrate 101. The second mask pattern 28 may be used as an etch mask so that the first mask pattern 25 may be selectively removed. Thus, those active fins of the active fins 1, 2, 3, 4, 5, 6, 7, 8, 9, 10, 11, 12, 13, 14, and 15 under the portion of the first mask pattern 25 being selectively removed may also be removed. A first active fin 1, a third active fin 3, a sixth active fin 6, an eighth active fin 8, a tenth active fin 10, a thirteenth active fin 13, and a fifteenth active fin 15 may be removed, and second trenches T2 may be formed (see FIGS. 12 and 13).

Figure 12:
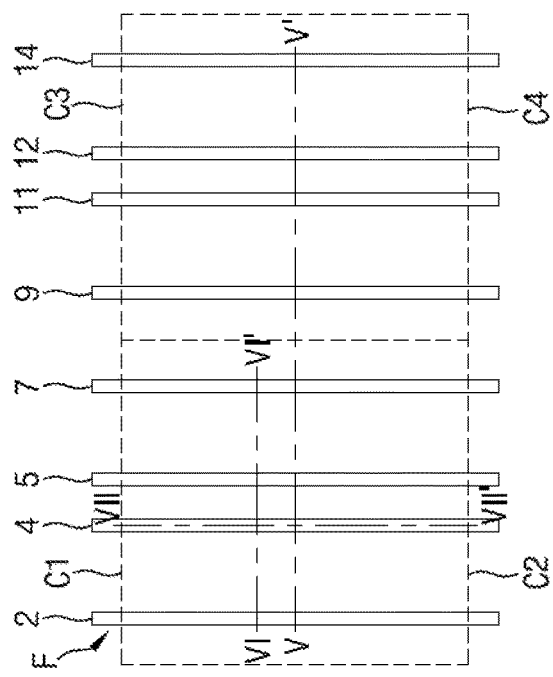
Figure 13:
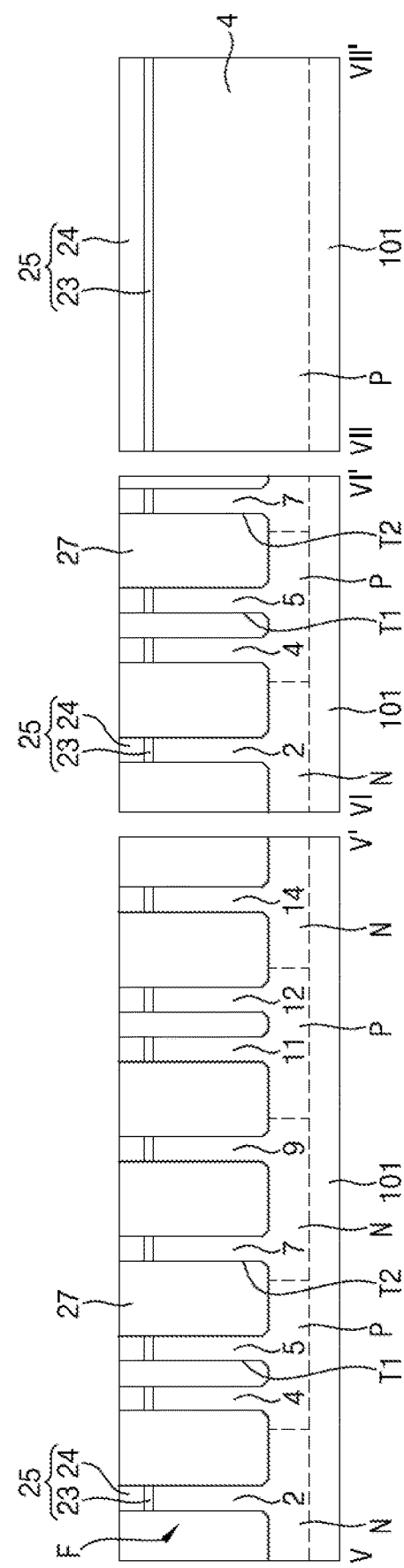

Referring to FIGS. 12 and 13, the second trenches T2 having widths greater than those of the first trenches T1 may be formed between the active fins 2, 4, 5, 7, 9, 11, 12, and 14. After the formation of the second trenches T2, the first trenches T1 may remain between active fins 4 and 5, and between active fins 11 and 12. The device isolation layer 27 may be formed in the second trenches T2. The active fins may be disposed relatively close to each other in the P-well P, and relatively far from each other in the N-well N. For example, the active fins 4 and 5 separated by the first trench T1 may be disposed in the P-well P. Similarly, the active fins 11 and 12 may also be disposed in the P-well P. The active fins 2, 7, 9, and 14, which are separated by the second trenches T2 may be disposed in the N-well N.

Figure 14:
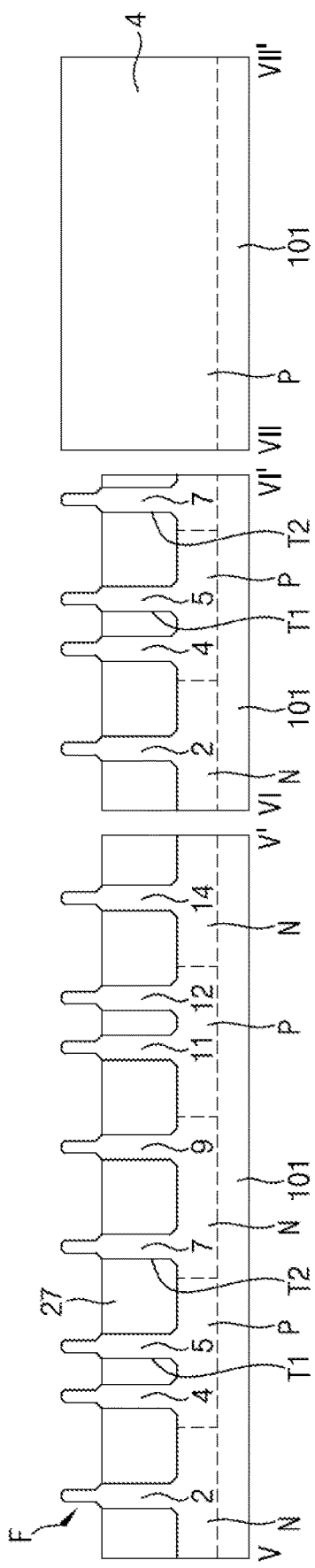

Referring to FIGS. 12 and 14, the first mask pattern 25 may be removed and the device isolation layer 27 may be recessed so that upper surfaces and side surfaces of the active fins 2, 4, 5, 7, 9, 11, 12, and 14 may be exposed. An upper surface of the device isolation layer 27 may be formed at a level lower than levels of upper ends of the active fins 2, 4, 5, 7, 9, 11, 12, and 14.

The active fins 2, 4, 5, 7, 9, 11, 12, and 14 may be partially etched, while the first mask pattern 25 is removed and the device isolation layer 27 is recessed. Each of the active fins 2, 4, 5, 7, 9, 11, 12, and 14 may protrude to a level higher than the upper surface of the device isolation layer 27 adjacent thereto. In each of the active fins 2, 4, 5, 7, 9, 11, 12, and 14, a horizontal width of a portion protruding to a level higher than the upper surface of the device isolation layer 27 adjacent thereto may be reduced. For example, the horizontal width of the portion of each of the active fins 2, 4, 5, 7, 9, 11, 12, and 14 protruding above the device isolation layer 27 may be smaller than that of the portion of each of the active fins 2, 4, 5, 7, 9, 11, 12, and 14 remaining below the upper surface of the device isolation layer 27. Each of the active fins 2, 4, 5, 7, 9, 11, 12, and 14 may have an upper end formed in a rounded shape.

Figure 15:
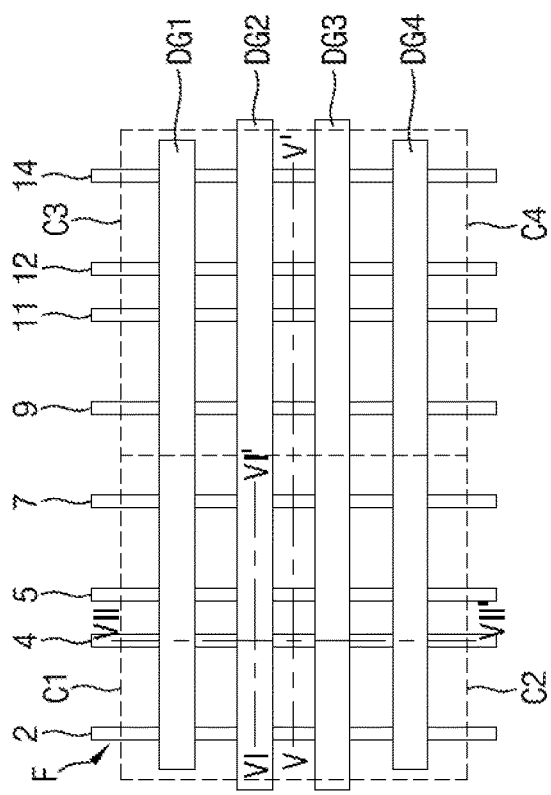
Figure 16:
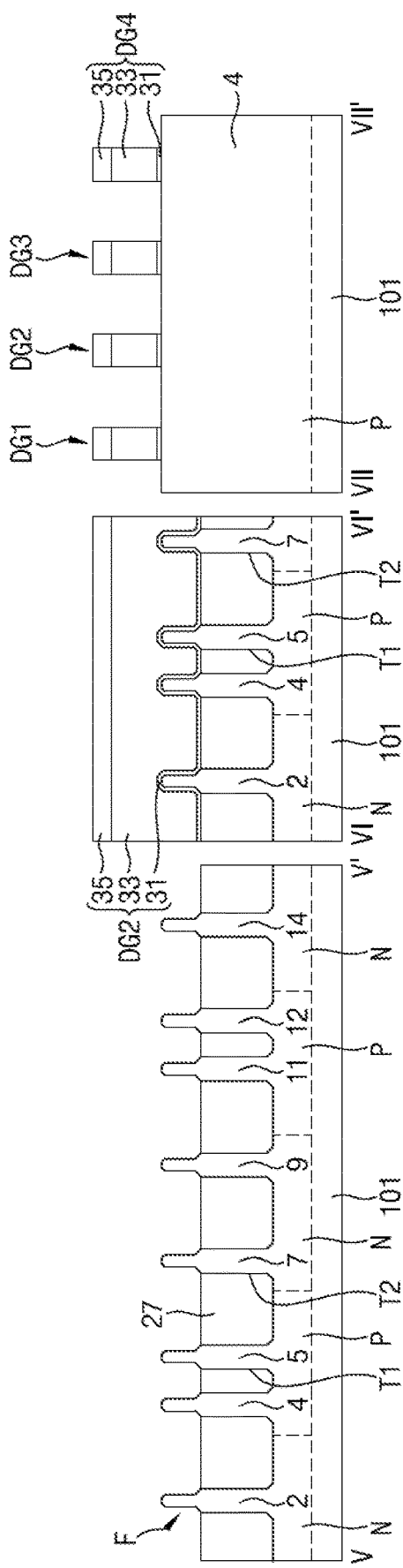

Referring to FIGS. 15 and 16, a plurality of dummy gate lines DG1, DG2, DG3, and DG4 crossing the active fins 2, 4, 5, 7, 9, 11, 12, and 14 may be formed. Each of the dummy gate lines DG1, DG2, DG3, and DG4 may include a second buffer layer 31, a temporary electrode 33, and a third mask pattern 35, which are sequentially stacked. The formation of the dummy gate lines DG1, DG2, DG3, and DG4 may include a plurality of thin film forming and patterning processes. The thin film forming process may include, for example, a chemical vapor deposition (CVD) process, an atomic layer deposition (ALD) process, a physical vapor deposition (PVD) process, or the like. The patterning processes may include a photolithographic process and an anisotropic etching process.

The second buffer layer 31 may include an insulating layer such as silicon oxide ($SiO_2$). The temporary electrode 33 may include a semiconductor layer, such as poly-Si. The third mask pattern 35 may include an insulating layer such as silicon oxide ($SiO_2$). The dummy gate lines DG1, DG2, DG3, and DG4 may cover the upper surfaces and side surfaces of the active fins 2, 4, 5, 7, 9, 11, 12, and 14.

Figure 17:
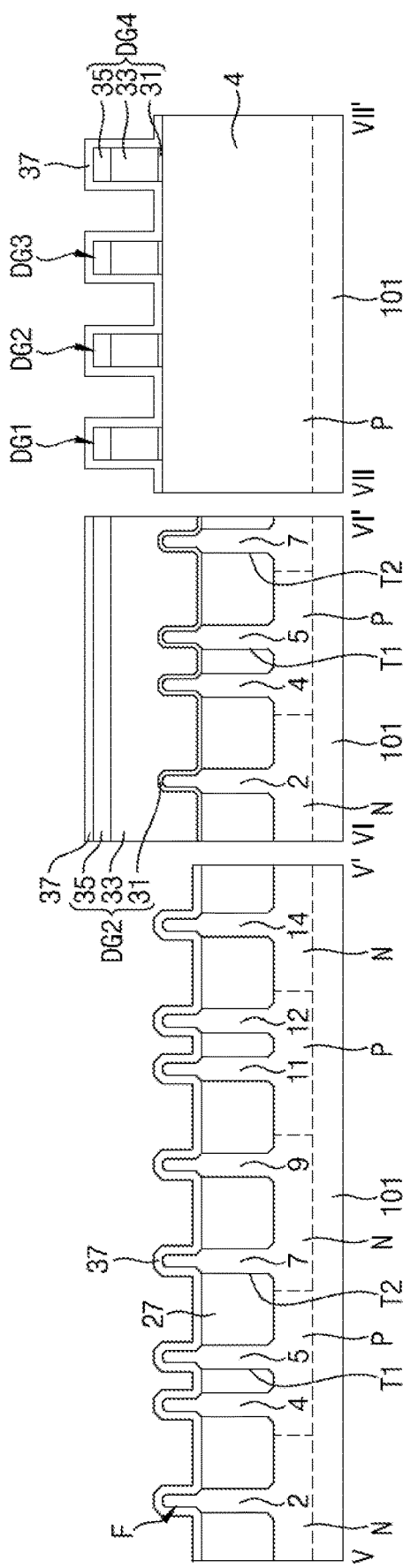

Referring to FIGS. 15 and 17, a spacer layer 37 covering surfaces of the active fins 2, 4, 5, 7, 9, 11, 12, and 14 and surfaces of the dummy gate lines DG1, DG2, DG3, and DG4 may be formed. The spacer layer 37 may cover side surfaces of the dummy gate lines DG1, DG2, DG3, and DG4. The spacer layer 37 may include a material having an etch selectivity with respect to the device isolation layer 27. For example, the spacer layer 37 may include silicon nitride ($Si_3N_4$). In an exemplary embodiment of the present inventive concept, the spacer layer 37 may include a plurality of insulating layers. For example, the spacer layer 37 may have a multi-layered structure including at least two layers of SiCN, SiCON, and $Si_3N_4$ layers.

Figure 18:
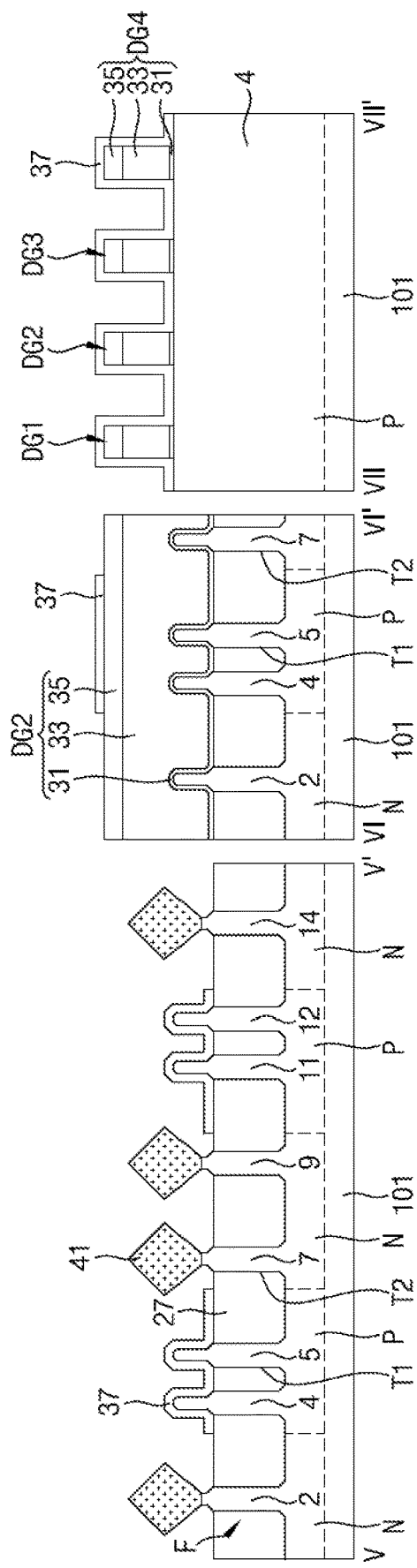

Referring to FIG. 18, the spacer layer 37 may be partially removed to expose upper surfaces of the active fins 2, 7, 9, and 14 and device isolation layer 27 which are disposed in the N-well N. Exposed upper ends of the active fins 2, 7, 9, and 14 may be partially removed so that recessed regions may be formed in the active fins 2, 7, 9, and 14. The recessed region may be formed using, for example, an anisotropic etching process, an isotropic etching process, a directional etching process, or a combination thereof. Bottoms of the recessed regions may be formed at a level higher than that of the upper surfaces of the device isolation layers 27 adjacent thereto. However, the present inventive concept is not limited thereto, and the bottoms of the recessed regions may be formed at a level corresponding to or lower than that of the upper surfaces of the device isolation layers 27.

A plurality of first source and drain regions 41 may be formed in the recessed regions of the active fins 2, 7, 9 and 14. The first source and drain regions 41 may be formed by a selective epitaxial growth (SEG) process. In an exemplary embodiment of the present inventive concept, the first source and drain region 41 may include a silicon germanium (SiGe) layer containing P-type impurities Upper ends of the first source and drain regions 41 may be positioned at a level higher than that of upper ends of the fourth, fifth, eleventh, and twelfth active fins 4, 5, 11, and 12. The first source and drain region 41 may have a pentagonal shape, but the present inventive concept is not limited thereto.

Figure 19:
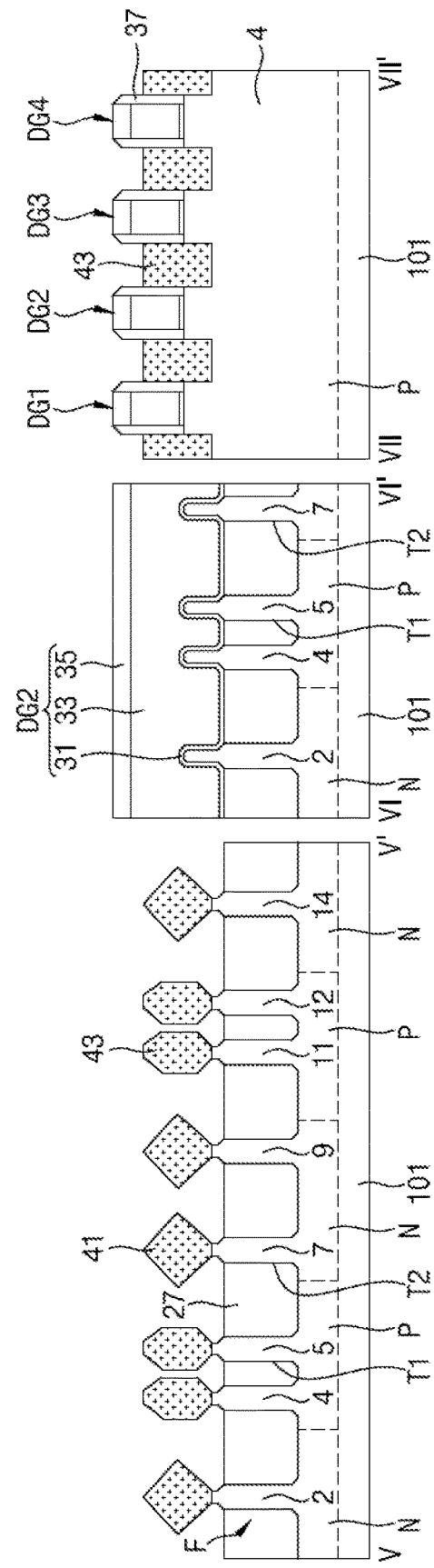

Referring to FIG. 19, a portion of the spacer layer 37 remained in the P-well P may be removed so that upper surfaces of the fourth, fifth, eleventh, and twelfth active fins 4, 5, 11, and 12 may be exposed and gate spacers 37 may be formed. Recessed regions may be formed in the fourth, fifth, eleventh, and twelfth active fins 4, 5, 11, and 12 using a method similar to that described with reference to FIGS. 17 and 18. A second source and drain region 43 may be formed using a SEG process in the recessed region. In an exemplary embodiment of the present inventive concept, the second source and drain region 43 may include a silicon carbide (SiC) layer containing N-type impurities or a silicon (Si) layer containing N-type impurities. The second source and drain region 43 may have a hexagonal shape, but the present inventive concept is not limited thereto.

Referring to FIGS. 20 and 21, an interlayer insulating layer 51 may be disposed on the device isolation layer 27, and may cover the source and drain regions 41 and 43. A fourth mask pattern 53 may be formed on the interlayer insulating layer 51, and may partially expose an upper surface of the interlayer insulating layer 51. The portion of the interlayer insulating layer 51 exposed by the fourth mask pattern 53 may be etched to form a third trench T3. A gate isolation layer IG may be formed in the third trench T3.

Referring to FIG. 22, the fourth mask pattern 53 may be removed and upper surfaces of the interlayer insulating layer 51 and the dummy gate lines DG1, DG2, DG3, and DG4 may be exposed. The second buffer layer 31, the temporary electrode 33 and the third mask pattern 35 of each of the dummy gate lines DG1, DG2, DG3, and DG4 may be removed through a gate replacement process. A gate insulating layer 61, gate electrodes 63 and 65, and a gate capping layer 67 may be formed between the gate spacers 37. Although the gate isolation layer IG is formed before the gate replacement process as shown in FIGS. 21 and 22. However, the present inventive concept is not limited thereto. For example, the gate isolation layer IG may also be formed after the gate replacement process. When the gate isolation layer IG is formed before the gate replacement process as shown in FIGS. 21 and 22, gate lines GL1, GL2, GL3, and GL4 formed may each have a structure as shown in FIG. 5A, and when the gate isolation layer IG is formed after the gate replacement process, the gate lines GL1, GL2, GL3, and GL4 formed may each have a structure as shown in FIG. 5B as described above.

Figure 23:
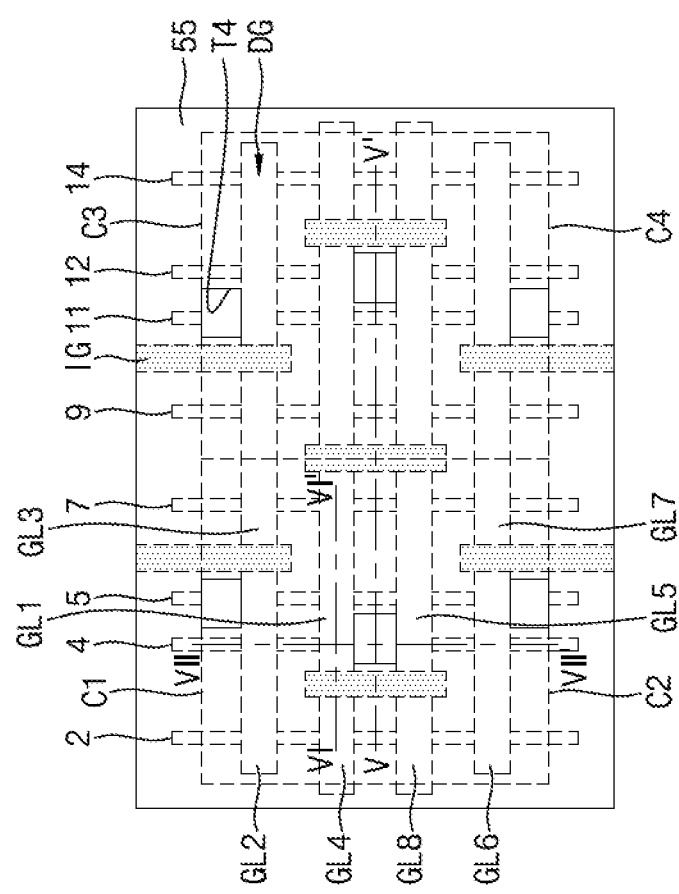
Figure 24:
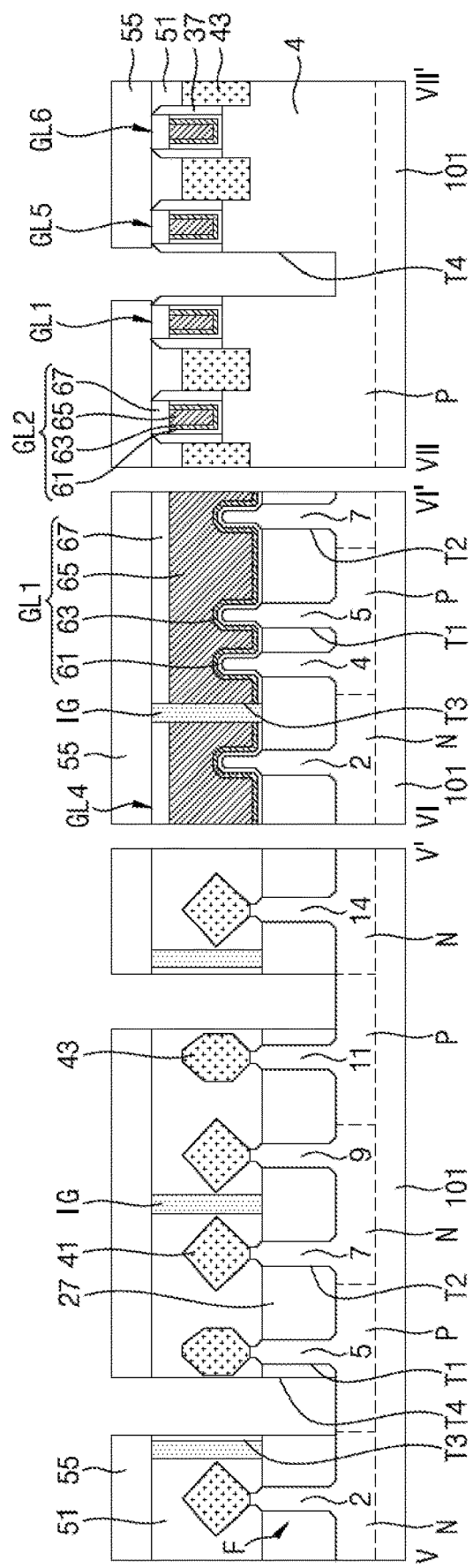

Referring to FIGS. 23 and 24, a fifth mask pattern 55, which covers the interlayer insulating layer 51, the gate isolation layer IG, and gate lines GL1, GL2, GL3, and GL4, may be formed. Here, different from FIG. 22, in FIG. 24, as an example that the gate isolation layer IG is formed after the gate replacement process, the gate lines GL1, GL2, GL3, and GL4 each has a structure similar to that shown in FIG. 5B. The fifth mask pattern 55 may expose a portion of the upper surface of the interlayer insulating layer 51. The exposed portion of the interlayer insulating layer 51 may be etched using the fifth mask pattern 55 as an etch mask to form a fourth trench T4. As shown in FIGS. 3 to 4B, a field isolation layer DB may be formed in the fourth trench T4. The field isolation layer DB may include a compressive stress material, such as a nitride, capable of applying a compressive stress to the adjacent active fins.

According to exemplary embodiments of the present inventive concept, in an integrated circuit device including SRAM cells, mobility of carriers can be enhanced by providing a compressive stress in channel regions of PMOS transistors.

While the exemplary embodiments of the present inventive concept have been described with reference to the accompanying drawings, it should be understood by those skilled in the art that various modifications may be made therein without departing from the spirit and scope of the present inventive concept as defined by the appended claims. The above-described exemplary embodiments should be considered in a descriptive sense only and not for purposes of limitation.

What is claimed is:

1. An integrated circuit device comprising a static random access memory (SRAM) array including a plurality of SRAM cells on a substrate,
   wherein the SRAM array comprises:
   first to fourth active fins extending in a first direction and disposed to be parallel to each other;
   a first gate line extending in a second direction intersecting the first direction and overlapping the second to fourth active fins;
   a second gate line spaced apart from the first gate line in the first direction, extending in the second direction, and overlapping the first to third active fins;
   a third gate line spaced apart from the first gate line in the first direction, extending in the second direction, and overlapping the fourth active fin;
   a fourth gate line spaced apart from the second gate line in the first direction, extending in the second direction, and overlapping the first active fin;
   a device isolation layer covering a lower sidewall of each of the first to fourth active fins;
   a first field isolation layer being in contact with one end of the second active fin; and
   a second field isolation layer being in contact with one end of the third active fin,
   wherein the first field isolation layer contacts a sidewall of the device isolation layer and protrudes above an upper surface of the device isolation layer, and aligns with the second active fin in the first direction.

2. The integrated circuit device of claim 1, wherein the first field isolation layer and the second field isolation layer each comprises a material that applies a compressive stress to the second active fin and the third active fin, respectively.

3. The integrated circuit device of claim 1, wherein the first field isolation layer and the second field isolation layer each comprises a nitride.

4. The integrated circuit device of claim 1, wherein a first pull-up transistor is formed at an intersection of the third active fin and the first gate line, and a second pull-up transistor is formed at an intersection of the second active fin and the second gate line.

5. The integrated circuit device of claim 4, wherein the first pull-up transistor and the second pull-up transistor are P-type metal oxide semiconductor (PMOS) transistors.

6. The integrated circuit device of claim 1, wherein the first field isolation layer is in contact with one side surface of the first gate line, and the second field isolation layer is in contact with one side surface of the second gate line.

7. The integrated circuit device of claim 1, further comprising:
   a first gate isolation layer disposed between the first gate line and the fourth gate line; and
   a second gate isolation layer disposed between the second gate line and the third gate line.

8. The integrated circuit device of claim 7, wherein the first field isolation layer is disposed to be spaced apart from the first gate isolation layer in the second direction, and the second field isolation layer is disposed to be spaced apart from the second gate isolation layer in the second direction.

9. The integrated circuit device of claim 7, wherein one side surface of the first field isolation layer is in contact with one side surface of the first gate isolation layer, and one side surface of the second field isolation layer is in contact with one side surface of the second gate isolation layer.

10. The integrated circuit device of claim 7, further comprising a source and drain region disposed on each of the first to fourth active fins,
wherein at least one of two side surfaces of each of the first field isolation layer and the second field isolation layer is in contact with the source and drain region.

11. The integrated circuit device of claim 7, wherein levels of upper ends of the first and second field isolation layers correspond to levels of upper ends of the first to fourth active fins.

12. An integrated circuit device comprising a static random access memory (SRAM) array including a plurality of SRAM cells on a substrate,
wherein the SRAM array comprises:
active fins extending in a first direction on the substrate;
gate lines intersecting the active fins and extending in a second direction perpendicular to the first direction;
inverters including pull-up transistors and pull-down transistors formed at intersections of the active fins and the gate lines;
a device isolation layer covering a lower sidewall of each of the active fins;
pass transistors connected to output nodes of the inverters; and
a field isolation layer being in a straight line with the pull-up transistors in the first direction,
wherein the gate lines comprise first gate lines shared by the pull-up transistors and the pull-down transistors, and second gate lines shared by the pass transistors, and
the field isolation layer contacts a sidewall of the device isolation layer and protrudes above an upper surface of the device isolation layer, and aligns with second active fin of the active fins in the first direction.

13. The integrated circuit device of claim 12, wherein the field isolation layer comprises a nitride.

14. The integrated circuit device of claim 12, wherein the SRAM array comprises N-type metal oxide semiconductor (NMOS) transistors and P-type MOS (PMOS) transistors, and the first gate lines are shared by transistors having channels of different conductivity types selected from the NMOS transistors and the PMOS transistors.

15. The integrated circuit device of claim 14, wherein the pull-up transistors are the PMOS transistors, and the pull-down transistors are the NMOS transistors.

16. The integrated circuit device of claim 12, wherein the SRAM array comprises NMOS transistors and PMOS transistors, and the second gate lines are shared by transistors having channels of the same conductivity type selected from the NMOS transistors and the PMOS transistors.

17. An integrated circuit device comprising:
a substrate including an NMOS region and a PMOS region;
a first active fin extending in a first direction in the PMOS region on the substrate;
a second active fin extending in the first direction in the PMOS region on the substrate and spaced apart from the first active fin in the first direction;
a device isolation layer covering a lower sidewall of each of the first active fin and the second active fin and extending in the first direction;
a first gate line intersecting the first active fin on the device isolation layer and extending in a second direction intersecting the first direction;
a second gate line intersecting the second active fin on the device isolation layer and extending in the second direction; and
a field isolation layer disposed between the first active fin, the second active fin, and the device isolation layer,
wherein the field isolation layer is in the PMOS region and comprises a nitride, and
a lower end of the field isolation layer extends downward to a level the same as a level of a lower end of the first active fin.

18. The integrated circuit device of claim 17, wherein a level of an upper end of the field isolation layer corresponds to a level of an upper end of the first gate line.

19. The integrated circuit device of claim 17, further comprising a source and drain region disposed on the first active fin,
wherein a level of an upper end of the field isolation layer is higher than a level of a lower end of the source and drain region and lower than a level of an upper end of the source and drain region.

20. The integrated circuit device of claim 17, further comprising a source and drain region disposed on the first active fin,
wherein a width of the field isolation layer in the second direction is narrower than a width of the source and drain region in the second direction.

* * * * *